United States Patent
Kuong et al.

(10) Patent No.: US 9,658,248 B2
(45) Date of Patent: May 23, 2017

(54) GROUND CONTACT OF AN INTEGRATED CIRCUIT TESTING APPARATUS

(71) Applicant: JF Microtechnology Sdn. Bhd., Petaling Jaya, Selangor (MY)

(72) Inventors: Foong Wei Kuong, Petaling Jaya (MY); Goh Kok Sing, Petaling Jaya (MY); Shamal Mundiyath, Petaling Jaya (MY)

(73) Assignee: JF MICROTECHNOLOGY SDN. BHD., Petaling Jaya (MY)

( * ) Notice: Subject to any disclaimer, the term of this patent is extended or adjusted under 35 U.S.C. 154(b) by 102 days.

(21) Appl. No.: 13/848,209

(22) Filed: Mar. 21, 2013

(65) Prior Publication Data

US 2014/0103952 A1  Apr. 17, 2014

(30) Foreign Application Priority Data

Oct. 12, 2012 (MY) .......................... PI 2012004588

(51) Int. Cl.
    *G01R 1/067* (2006.01)
    *G01R 1/04* (2006.01)
(52) U.S. Cl.
    CPC ........... *G01R 1/067* (2013.01); *G01R 1/0466* (2013.01)
(58) Field of Classification Search
    CPC ... H01R 13/28; H01R 13/2457; G01R 1/0416
    See application file for complete search history.

(56) References Cited

U.S. PATENT DOCUMENTS

| | | | | |
|---|---|---|---|---|
| 3,523,273 | A * | 8/1970 | Hammell | H01R 13/28 439/249 |
| 6,204,675 | B1 * | 3/2001 | Moewes | G01R 31/01 294/64.3 |
| 6,299,459 | B1 * | 10/2001 | Botka et al. | 439/66 |
| 7,097,485 | B1 * | 8/2006 | Wang | H01R 12/714 439/289 |
| 8,441,275 | B1 * | 5/2013 | Alladio | 324/756.02 |
| 2004/0106310 | A1 * | 6/2004 | Gilk et al. | 439/92 |
| 2010/0062662 | A1 * | 3/2010 | Osato | 439/824 |
| 2010/0323564 | A1 * | 12/2010 | Clark | H01R 13/2457 439/862 |

\* cited by examiner

*Primary Examiner* — Son Le
*Assistant Examiner* — Adam Clarke
(74) *Attorney, Agent, or Firm* — Maschoff Brennan

(57) ABSTRACT

A ground electrical contact for an integrated circuit (IC) testing apparatus that comprises: a rigid bottom member having two planar surfaces that slope towards each other, so that the bottom member forms a partial wedge shape with the top end of the wedge being narrower than the bottom end; a flexible top member having two arms extending over said bottom member such that the top member forms an inverted U-shape, said two arms having an inwards bias such that an inner surface of each arm is pressed in contact with each planar surface; and a compressible member located between the narrower end of said bottom member and a bifurcation inner surface, which is an inner surface where the two arms bifurcate in the top member. The bottom member and top member are made of an electrically conductive material.

3 Claims, 2 Drawing Sheets

GROUND CONTACT OF AN INTEGRATED CIRCUIT TESTING APPARATUS

FIELD OF INVENTION

The present invention relates generally to electrical contacts, and more specifically to a ground electrical contact of an integrated circuit testing apparatus.

BACKGROUND OF INVENTION

In the field of integrated circuit testing, many solutions exist for electrically connecting the leads of the integrated circuit (IC) device and a test apparatus. Many of the current solutions have interconnect designs that do not allow for very small IC devices. As the trend is for these IC devices to get smaller and smaller, a solution that will enable testing of smaller IC devices is needed. One of the main reasons the current designs are not able to test smaller IC devices is the need to accommodate a ground contacting solution within the limited space of the socket. It is therefore desirable to have a ground contact design that is smaller whilst still meeting reliability and economical requirements.

Another consideration in the testing of IC devices is the assembly time of the testing solution. Current solutions have typically 3 or 4 elements that have to be assembled, and this takes time. It is therefore desirable to have a design that allows faster assembly of the testing solution.

Yet another consideration in the testing of IC devices is the gram force exerted by the electrical contact on the IC device and test apparatus during testing. The lower the gram force, the less wear and tear there is on the contact points of the testing apparatus. There is however, a minimum gram force that is needed to ensure proper testing. It is therefore desirable to be able to control the gram force.

SUMMARY OF INVENTION

The present invention seeks to overcome the aforementioned disadvantages by providing a vertically oriented ground contact design, which requires minimal space and allows for testing of IC devices down to, for example, 2 mm×2 mm, 2 mm×3 mm, 3 mm×3 mm, 1.8 mm×2.6 mm, 3.2 mm×1.8 mm, etc. in size, whilst providing a good electrical contact with maximum area of electrical connectivity, is coplanar, and has increased mean time between assists (MTBA) and mean time between fracture (MTBF). The present invention comprises 3 elements with a design that allows for quick assembly, and allows control of gram force by virtue of the placement of the compressible member in its design.

This invention thus relates to a ground electrical contact for an integrated circuit (IC) testing apparatus that comprises: a rigid bottom member having two planar surfaces that slope towards each other, so that the bottom member forms a partial wedge shape with the narrower end of the wedge facing upwards; a flexible top member having two arms extending over said bottom member such that the top member forms an inverted U-shape, said two arms having an inwards bias when clasped over the said bottom member, such that an inner surface of each arm is pressed in contact with each planar surface; and a compressible member located between the narrower end of said bottom member and a bifurcation inner surface, which is an inner surface where the two arms bifurcate in the top member. The angle of the slope of the planar surfaces of the bottom member to the vertical is preferably between 0° and 20°, more preferably between 13° and 17°, and even more preferably around 15°. The bottom member and top member are made of an electrically conductive material. The compressible member can be made of any compressible material including elastomeric materials such as, but not limited to, silicon rubber.

The said inwards bias of the two arms is created so: The top member is designed to allow flexing of the two arms about the top of the inverted U-shape. The said arms are designed to be such a distance apart from each other when unstressed, so that an inwards bias is created when the two arms are positioned over the bottom member. This results in an inner surface of said left arm being pressed in contact with said left planar surface, and an inner surface of said right arm being pressed in contact with said right planar surface.

Although the above is a preferred embodiment, there is also an embodiment where the two planar surfaces do not slope towards each other, but are parallel with each other. In this embodiment, the inwards bias of the two arms against the bottom member provides for continuous contact between the top and bottom members during testing of an IC device, that is, when the top member is pushed down towards the bottom member.

In a preferred embodiment, the compressible member has a cylindrical shape, with its axis in a horizontal plane, that is, perpendicular to a force applied to it during testing of the IC device. In this embodiment, the narrower end of the bottom member is adapted to match and receive the said compressible member. In other words, the narrower end of the bottom member has an upper side that is curved to receive the cylindrical shape of the compressible member. Also in this embodiment, an inner surface of the top member where the two arms bifurcate, known as the bifurcate inner surface, is also adapted, or curved, to match and receive the cylindrical shape of the compressible member. Other objects and advantages will be more fully apparent from the following disclosure and appended claims.

DETAILED DESCRIPTION OF INVENTION

Figure 1:
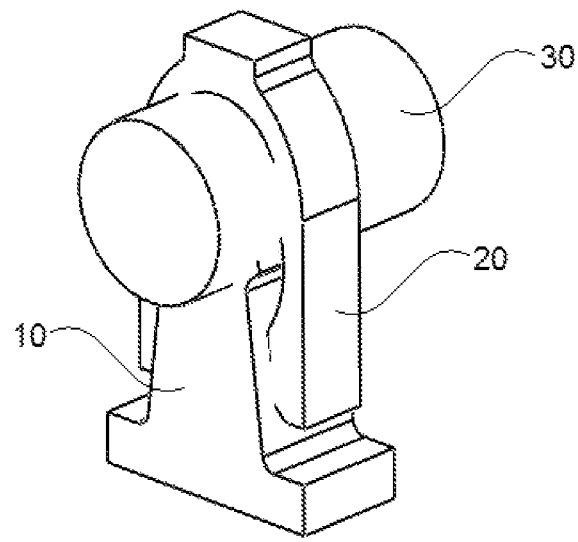
FIG. 1 shows a perspective view of a ground contact in an embodiment of the present invention.

It should be noted that the following detailed description is directed to a ground electrical contact of an integrated circuit testing apparatus, and is not limited to any particular size or configuration but in fact a multitude of sizes and configurations within the general scope of the following description.

List of Numbered Elements in Figures
Bottom member (10)
Left planar surface (12) of bottom member
Right planar surface (14) of bottom member
Top end (16) of bottom member
Top member (20)
Left arm (22) of top member Left arm inner surface (23) of top member
Right arm (24) of top member
Right arm inner surface (25) of top member
Bifurcation inner surface (26) of top member
Compressible member (30)
Cavity (40)
Socket housing (50)
Hard stopper (52)

Figure 2:
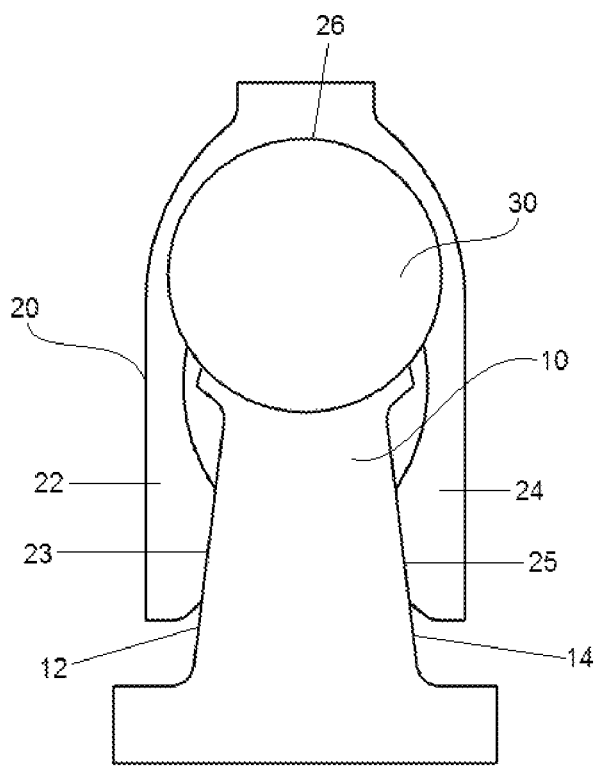
FIG. 2 shows a cross-sectional view of a ground contact in an uncompressed state in an embodiment of the present invention.

Referring to FIGS. 1 and 2, there is shown a ground electrical contact of an integrated circuit (IC) testing apparatus. A rigid bottom member (10) having a left planar surface (12) and a right planar surface (14) that slope towards each other, so that said bottom member forms a partial wedge shape with a top end (16) of the wedge being narrower than a bottom end, is shown. The angle of the slope of the planar surfaces (12, 14) to the vertical is around 15°, but may range between 0° and 20°. A top member (20) having two arms, a left arm (22) and a right arm (24), extending over said bottom member (10), such that the top member forms an inverted U-shape that clasps the bottom member (10), is also shown. The top member (20) is designed to allow flexing of the two arms (22, 24) about the top of the inverted U-shape. The said arms (22, 24) are designed such a distance apart from each other so that an inwards bias is created when the two arms (22, 24) are positioned over the bottom member (10). Thus, an inner surface (23) of said left arm (22) is pressed in contact with said left planar surface (12), and an inner surface (25) of said right arm (24) is pressed in contact with said right planar surface (14). Also shown is a compressible member (30) that is located between the said narrower end (16) of the said bottom member (10) and a bifurcation inner surface (26), which is an inner surface where the said two arms (22, 24) bifurcate in the top member (20). The bottom member (10) and top member (20) are made of any electrically conductive material.

In the preferred embodiment shown in the figures, the said compressible member (30) is cylindrical in shape. The axis of this cylinder is in a horizontal plane, that is, perpendicular to the direction of a force applied to it during testing of the IC device. The top end (16) of the bottom member (10) is adapted to match and receive the cylindrical shape of the compressible member (30). In other words, the top end (16) of the bottom member (10) has an upper side that is curved to receive the cylindrical shape of the compressible member (30). A bifurcation inner surface (26) of the top member, that is where the two arms (22, 24) bifurcate, is likewise adapted, or curved, to match and receive the cylindrical shape of the compressible member (30). An upper portion of the top member (20) absorbs the force stresses as the IC device contacts the top member (20), and this force is dissipated into the compressible member (30).

Figure 3:
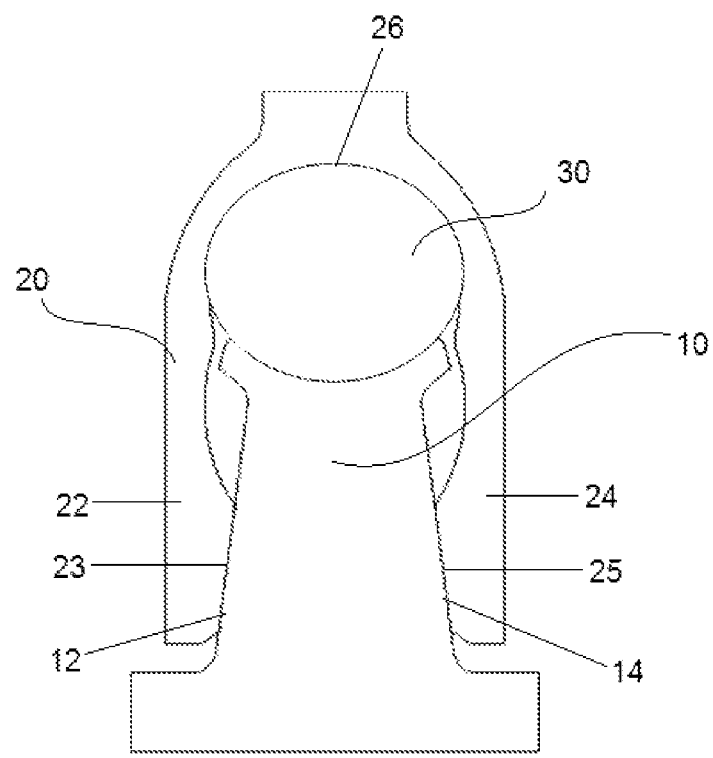
FIG. 3 shows a cross-sectional view of a ground contact in a compressed state in an embodiment of the present invention.

FIGS. 2 and 3 show the ground contact of the present invention in an uncompressed and a compressed state, respectively. As illustrated by these figures, during testing of the IC device, the top member (20) is first subjected to a downwards force from the IC device above. When this happens, the compressible member (30) compresses and allows the said top member to move closer towards the bottom member (10). As this happens, the inner surfaces (23, 25) of the said arms (22, 24) slide downwards along the sloping planar surfaces (12, 14) of the bottom member (10), and the two arms (22, 24) of the top member flex outwards, and maintain inward pressure on the said planar surfaces (12, 14) of said bottom member (10). When the IC device is lifted away from the testing apparatus, the compressible member (30) forces the top member (20) away from the said bottom member (10). As this happens, the inwards pressure of the two arms (22, 24) acting on the said planar surfaces (12, 14) of bottom member (10) keeps the inner surfaces (23, 25) of each arm in contact with the said planar surfaces (12, 14) of the said bottom member (10). In this way, electrical contact is maintained throughout the testing period.

Figure 4:
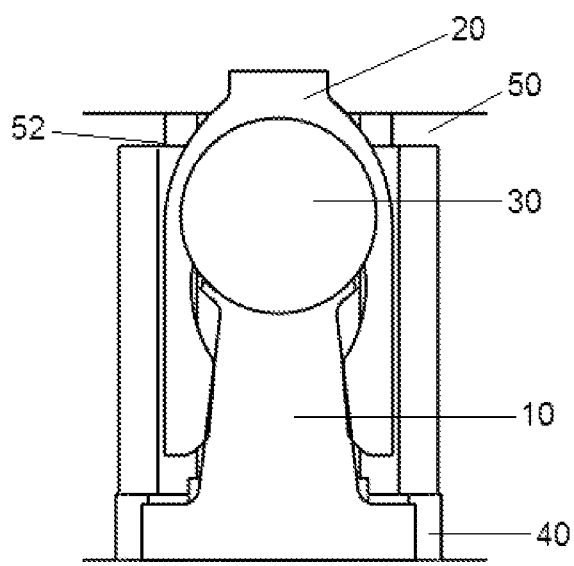
FIG. 4 shows a cross-sectional view of a ground contact in an embodiment of the present invention assembled in its cavity and socket housing.

FIG. 4 shows a ground contact in an embodiment of the present invention having been assembled in its cavity (40) and socket housing (50). The cavity (40) is provided to allow the bottom element to be seated properly and securely. The socket housing (50) is used to guide, hold and pretension the ground contact during testing of an IC device. A hard stopper (52) is provided to ensure, along with an upwards bias of the compressible member (30), that the top member (20) is oriented upright after every test. This hard stopper (52) also ensures that the ground contact does not exceed a maximum design height. The entire assembly in the uncompressed state mentioned above is already slightly pre-tensioned by the action of the socket housing (50) on the top member (20), which slightly compresses the compressible member (30). As an IC device is lowered onto the top member (20) during testing, the top member moves downwards towards the bottom member (10) as the compressible member (30) is further compressed. The socket housing aligns the top member (20) so that it does not move laterally during testing.

The said inner surfaces (23, 25) of the two arms (22, 24) are not at the same angle as the said planar surfaces (12, 14) of the bottom member (10) when the ground contact is in an uncompressed state, so that, when the IC device is being tested, and full electrical connection is needed, that is when the ground contact is in a compressed state, the angles of the inner surfaces (23, 25) are more parallel with the planar surfaces (12, 14), to allow for maximum electrical contact.

Another aspect of this invention is the way the ground contact is assembled. The design of this invention calls for the top member (20) is inserted first into the socket housing (50). The compressible member (30) is then inserted into the cavity (40), and lastly the bottom member (10) is inserted to form the complete assembly. The curved upper side of the narrow end (16) of the bottom member (10) prevents the cylindrical compressible member (30) from falling or getting otherwise dislodged during assembly. This results in a faster assembly time, with a lower chance of assembly error.

During the mounting of the socket housing (50) onto the rest of the test apparatus, such as the load board, the bottom member (10) is pre-tensioned and compressed to firmly rest on the load board, thus balancing out any irregularities of the surface of the load board. This exerts a force on to the top member (20) by the action of the compressible member (30), thus guiding the top member (20) into position.

While several particularly preferred embodiments of the present invention have been described and illustrated, it should now be apparent to those skilled in the art that various changes and modifications can be made without departing from the spirit and scope of the invention. Accordingly, the following claims are intended to embrace such changes, modifications, and areas of application that are within the scope of this invention.

The invention claimed is:

1. An electrical contact for use in an integrated circuit testing apparatus, comprising:
    a rigid bottom member having two planar surfaces, said bottom member formed of an electrically conductive material, and said two planar surfaces sloping towards each other at an angle of between 5° and 20° to a vertical direction;

a flexible top member having two arms extending over said bottom member, said two arms having an inwards bias such that an inner surface of each said arm is pressed in contact with each said planar surface, so that as the top member is lowered towards the bottom member, the two arms of the top member flex outwards while maintaining an inward pressure on the said planar surfaces of said bottom member, and said top member formed of an electrically conductive material; and a compressible member located between a top end of said bottom member and a bifurcation inner surface of said top member, said compressible member exerting an outward force on said two arms when compressed.

2. An electrical contact for use in an integrated circuit testing apparatus according to claim 1, wherein the said compressible member has a cylindrical shape, and the said top end of said bottom member is adapted to match and receive the said compressible member.

3. An electrical contact for use in an integrated circuit testing apparatus according to claim 2, wherein the said bifurcation inner surface of said top member is adapted to match and receive the said compressible member.

* * * * *